US007607065B2

(12) United States Patent
Bickerstaff et al.

(10) Patent No.: US 7,607,065 B2
(45) Date of Patent: Oct. 20, 2009

(54) METHOD AND APPARATUS FOR BLOCK AND RATE INDEPENDENT DECODING OF LDPC CODES

(75) Inventors: Mark Andrew Bickerstaff, Carlingford (AU); Graeme Edwin Pope, Newtown (AU); Benjamin John Widdup, Glenwood (AU); Graeme Kenneth Woodward, Epping (AU)

(73) Assignee: Agere Systems Inc., Allentown, PA (US)

( * ) Notice: Subject to any disclaimer, the term of this patent is extended or adjusted under 35 U.S.C. 154(b) by 509 days.

(21) Appl. No.: 11/191,158

(22) Filed: Jul. 27, 2005

(65) Prior Publication Data

US 2007/0038914 A1    Feb. 15, 2007

(51) Int. Cl.
*H03M 13/00* (2006.01)
(52) U.S. Cl. ............. 714/755; 714/786; 714/758
(58) Field of Classification Search ............ 714/758, 714/755, 786
See application file for complete search history.

(56) References Cited

U.S. PATENT DOCUMENTS

| 2005/0149843 A1* | 7/2005 | Shen et al. ............... 714/800 |
| 2006/0047857 A1* | 3/2006 | Dabiri et al. ............. 709/250 |
| 2006/0117240 A1* | 6/2006 | Novichkov et al. ........ 714/758 |

OTHER PUBLICATIONS

Hocevar, D.E., "Efficient Encoding for a Family of Quasi-Cyclic LDPC Codes," IEEE Global Comm. Conf. (Globecom), pp. 3996-4000 (Dec. 2003).
Hocevar, D.E., "LDPC Code Construction with Flexible Hardware Implementation," Proc. IEEE Inter'l Conf. On Comm. (ICC), pp. 2708-2712 (May 2003).
Hocevar, D.E., "A Reduced Complexity Decoder Architecture Via Layered Decoding of LDPC Codes," IEEE SIPS, pp. 107-112 (Dec. 2004).
Fanucci et al., "High-Throughput Multi-Rate Decoding of Structured Low-Density Parity-Check Codes," IEICE Transactions on Fundamentals of Electronics, Communicatins and Computer Sciences, Engineering Sciences Society, vol. E88-A, No. 12, pp. 3539-3547 (Dec. 2005).
Hansen et al., WwiSE Proposal: High Throughput Extension to the 802.11 Standard, IEEE P802.11 Wireless LANs [Online], pp. 1-100 (Jan. 2005).
Olcer, S., "Decoder Architecture for Array-Code Based LDPC Codes," IEEE Global Telecommunications Conference, vol. 7 of 7, pp. 2046-2050 (Dec. 1, 2003).

(Continued)

*Primary Examiner*—Guy J Lamarre
(74) *Attorney, Agent, or Firm*—Ryan, Mason & Lewis, LLP

(57) ABSTRACT

Methods and apparatus are provided for block and rate independent decoding of LDPC codes. The disclosed LDPC decoders support multiple code block lengths and code rates, as well as a variable parity check matrix. The disclosed LDPC decoders decode LDPC codes that are based on a parity check matrix having a plurality of sub-matrices, wherein each row and column of the plurality of sub-matrices has a single entry. Each of the sub-matrices has at least one associated Phi-node, wherein each Phi-node comprises a memory device having a plurality of memory elements, wherein one or more of the memory elements may be selectively disabled. The Phi-nodes may be selectively disabled, for example, at run-time. The Phi-node optionally further comprises a multiplexer in order to provide a variable parity check matrix.

27 Claims, 6 Drawing Sheets

OTHER PUBLICATIONS

Sun et al., "Field Programmable Gate Array Implementation of a Generalized Decoder for Structured Low-Density Parity Check Codes," Field-Programmable Technology Proceedings, IEEE International Confrerence on Bristane, Australia, pp. 17-24 (Dec. 6, 2004).

* cited by examiner $$H = \begin{bmatrix} 1 & 0 & 0 & 1 & 1 & 0 \\ 0 & 1 & 0 & 1 & 0 & 1 \\ 0 & 0 & 1 & 0 & 1 & 1 \end{bmatrix}$$

$$H = \begin{bmatrix} I_m^2 & 0 & 0 & I_m^{21} & I_m^{30} & 0 \\ 0 & I_m^3 & 0 & I_m^1 & 0 & I_m^{16} \\ 0 & 0 & I_m^7 & 0 & I_m^{11} & I_m^1 \end{bmatrix}$$

FIG. 4

$$H = \begin{bmatrix} \begin{bmatrix} 0 & 0 & 1 \\ 1 & 0 & 0 \\ 0 & 1 & 0 \end{bmatrix} & \begin{bmatrix} 0 & 0 & 0 \\ 0 & 0 & 0 \\ 0 & 0 & 0 \end{bmatrix} & \begin{bmatrix} 0 & 0 & 0 \\ 0 & 0 & 0 \\ 0 & 0 & 0 \end{bmatrix} & \begin{bmatrix} 1 & 0 & 0 \\ 0 & 1 & 0 \\ 0 & 0 & 1 \end{bmatrix} & \begin{bmatrix} 1 & 0 & 0 \\ 0 & 1 & 0 \\ 0 & 0 & 1 \end{bmatrix} & \begin{bmatrix} 0 & 0 & 0 \\ 0 & 0 & 0 \\ 0 & 0 & 0 \end{bmatrix} \\ \begin{bmatrix} 0 & 0 & 0 \\ 0 & 0 & 0 \\ 0 & 0 & 0 \end{bmatrix} & \begin{bmatrix} 1 & 0 & 0 \\ 0 & 1 & 0 \\ 0 & 0 & 1 \end{bmatrix} & \begin{bmatrix} 0 & 0 & 0 \\ 0 & 0 & 0 \\ 0 & 0 & 0 \end{bmatrix} & \begin{bmatrix} 0 & 1 & 0 \\ 0 & 0 & 1 \\ 1 & 0 & 0 \end{bmatrix} & \begin{bmatrix} 0 & 0 & 0 \\ 0 & 0 & 0 \\ 0 & 0 & 0 \end{bmatrix} & \begin{bmatrix} 0 & 1 & 0 \\ 0 & 0 & 1 \\ 1 & 0 & 0 \end{bmatrix} \\ \begin{bmatrix} 0 & 0 & 0 \\ 0 & 0 & 0 \\ 0 & 0 & 0 \end{bmatrix} & \begin{bmatrix} 0 & 0 & 0 \\ 0 & 0 & 0 \\ 0 & 0 & 0 \end{bmatrix} & \begin{bmatrix} 0 & 1 & 0 \\ 0 & 0 & 1 \\ 1 & 0 & 0 \end{bmatrix} & \begin{bmatrix} 0 & 0 & 0 \\ 0 & 0 & 0 \\ 0 & 0 & 0 \end{bmatrix} & \begin{bmatrix} 0 & 0 & 1 \\ 1 & 0 & 0 \\ 0 & 1 & 0 \end{bmatrix} & \begin{bmatrix} 0 & 1 & 0 \\ 0 & 0 & 1 \\ 1 & 0 & 0 \end{bmatrix} \end{bmatrix}$$

FIG. 5

INITIALIZATION

$$q_{ij}(0) \leftarrow 1 - p_i = Pr(m_i = 1 | y_i) = \frac{1}{1 + e^{\frac{-2y_i}{\sigma^2}}}$$

$$q_{ij}(1) \leftarrow p_i = Pr(m_i = -1 | y_i) = \frac{1}{1 + e^{\frac{2y_i}{\sigma^2}}}$$

ITERATION STEP 1

$$r_{ji}(0) \leftarrow \tfrac{1}{2} + \tfrac{1}{2} \prod_{i' \in R_j \setminus i} (1 - 2q_{i'j})$$

$$r_{ji}(1) \leftarrow 1 - r_{ji}(0)$$

ITERATION STEP 2

$$q_{ij}(0) \leftarrow k_{ij}(1 - p_i) \prod_{j' \in C_i \setminus j} r_{j'i}(0)$$

$$q_{ij}(1) \leftarrow k_{ij} p_i \prod_{j' \in C_i \setminus j} r_{j'i}(1)$$

WHERE $k_{ij}$ IS CHOSEN TO ENSURE THAT $q_{ij}(0) + q_{ij}(1) = 1$.

FIG. 6

INITIALIZATION

$$\log q_{ij} \leftarrow \log L_i = \frac{2y_i}{\sigma^2} = \log\left(\frac{P(m_i=1)}{P(m_i=0)}\right) \quad \text{—600-1}$$

ITERATION STEP 1

$$\log r_{ji} \leftarrow \left(\prod_{i' \in R_j \setminus i} \operatorname{sgn}(\log q_{i'j})\right) \cdot \Phi\left(\sum_{i' \in R_j \setminus i} \Phi(\log |q_{i'j}|)\right) \quad \text{—600-2}$$

ITERATION STEP 2

$$\log q_{ij} \leftarrow \log L_i + \sum_{j' \in C_i \setminus j} \log r_{j'i} \quad \text{—600-3}$$

$$\log Q_i \leftarrow \log L_i + \sum_{j' \in C_i} \log r_{j'i} \quad \text{—600-4}$$

FIG. 7

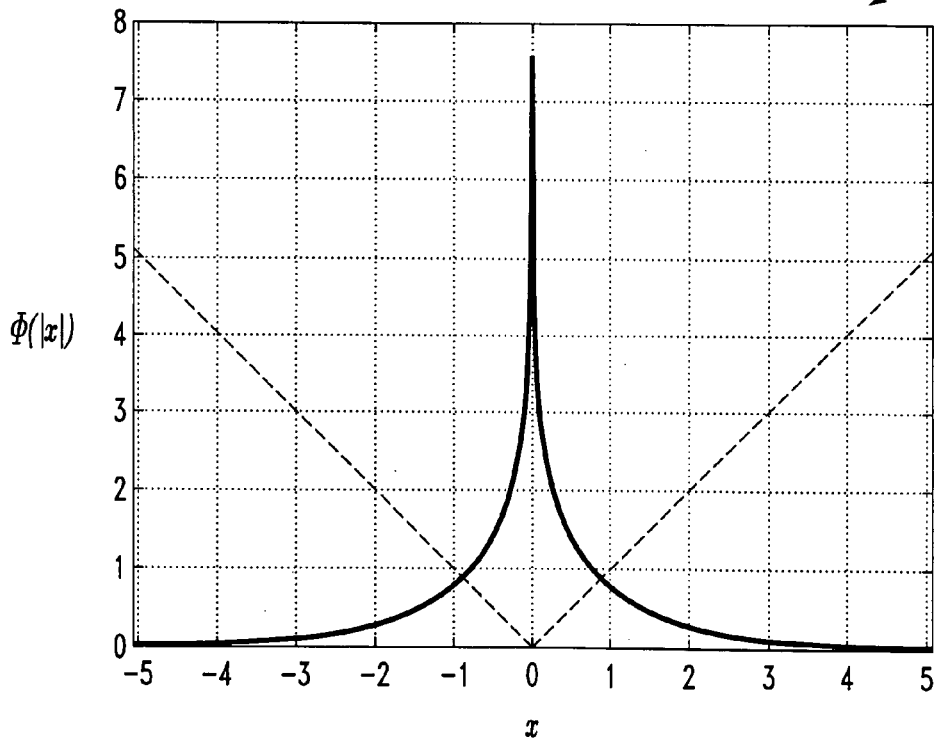

METHOD AND APPARATUS FOR BLOCK AND RATE INDEPENDENT DECODING OF LDPC CODES

FIELD OF THE INVENTION

The present invention is related to techniques for decoding low density parity check (LDPC) codes and, more particularly, to configurable techniques for decoding quasi-cyclic low density parity check (LDPC) codes.

BACKGROUND OF THE INVENTION

Errors can occur when information is transmitted between a transmitter and a receiver. Error correction codes, such as Low Density Parity Check (LDPC) codes, are often used to detect and correct such errors. LDPC codes are block codes based on a parity check matrix, H. See, for example, R. G. Gallager, "Low-Density Parity-Check Code," IRE Trans. Inform. Theory, vol. IT-8, 21-28 (January 1962). LDPC codes are being proposed or suggested for use in a variety of transmission systems, such as satellite communications, wireless transmissions, fiber optics, and a variety of storage media, including hard disk drives, optical disks, and magnetic bands.

A given LDPC code is defined by a parity check matrix, H. A non-zero entry of the parity check matrix defines a parity check used to detect and correct errors in the received codeword. An LDPC parity check matrix is said to be sparse. In other words, there are a small number of non-zero entries in the matrix relative to the size of the matrix. If the parity check matrix, H, has dimension (n-k, n), a codeword is said to be n bits long with k information bits and n-k parity check bits. A parity check matrix for an (n, k) code has n columns and n-k rows.

Quasi-cyclic LDPC codes combine some of the advantages of random and structured code constructions. Encoding of random LDPC codes is typically an "order of $n^2$" ($O(n^2)$) operation. Quasi-cyclic LDPC codes combine good error rate performance with the opportunity for simplified encoding and decoding. As a result, quasi-cyclic LDPC codes have been proposed for the IEEE 802.16e standard.

LDPC decoders have traditionally been designed for a specific parity check matrix, H. Thus, the block length that the decoder processes and the rate of the code are fixed for the particular architecture. A need therefore exists for LDPC decoders that can support multiple code block lengths and code rates. A further need exists for LDPC decoders that can support a variable parity check matrix.

SUMMARY OF THE INVENTION

Generally, methods and apparatus are disclosed for block and rate independent decoding of LDPC codes. The disclosed LDPC decoders support multiple code block lengths and code rates, as well as a variable parity check matrix. The disclosed LDPC decoders decode LDPC codes that are based on a parity check matrix having a plurality of sub-matrices, wherein each row and column of the plurality of sub-matrices has a single non-zero entry. For example, each of the plurality of sub-matrices, $I_m^l$, is an m by m identity matrix cyclically-shifted by l.

According to one aspect of the invention, each of the sub-matrices has at least one associated Phi-node, wherein each Phi-node comprises a memory device having a plurality of memory elements, wherein one or more of the memory elements may be selectively disabled. In one implementation, the plurality of memory elements comprises $m_{max}$ memory elements and wherein a code with submatrix dimension up to $m_{max} \cdot m_{max}$ can be realized.

According to another aspect of the invention, the Phi-nodes may be selectively disabled. For example, one or more rows or columns of Phi-nodes may be selectively disabled. In one implementation, a Phi-node is selectively disabled by setting a memory associated with the Phi-node to 0.

According to yet another aspect of the invention, the Phi-nodes may be selectively disabled at run-time and wherein the at least one Phi-node further comprises a multiplexer. In this manner, a variable parity check matrix is provided. Again, the Phi-node may be selectively disabled, for example, by setting a memory associated with the Phi-node to 0. A plurality of Phi-nodes are connected to a row summer and the multiplexer is a one-to-many multiplexer that selects the columns that the at least one Phi-node is connected to.

A more complete understanding of the present invention, as well as further features and advantages of the present invention, will be obtained by reference to the following detailed description and drawings.

BRIEF DESCRIPTION OF THE DRAWINGS

FIG. 4 illustrates a parity check matrix for the exemplary LDPC code of FIG. 3 when m is equal to 3;

FIG. 5 illustrates an exemplary decoding algorithm for quasi-cyclic LDPC codes;

FIG. 6 illustrates an alternate decoding algorithm for quasi-cyclic LDPC codes that converts multiplication operations to additions by operating in the log domain;

FIG. 7 illustrates a function $\Phi(x)$ employed by the decoding algorithm of FIG. 6;

DETAILED DESCRIPTION

The present invention provides LDPC decoders that can support multiple code block lengths and code rates. According to another aspect of the invention, LDPC decoders are provided that can support a variable parity check matrix.

LDPC Codes

Figures 1, 2, 3:
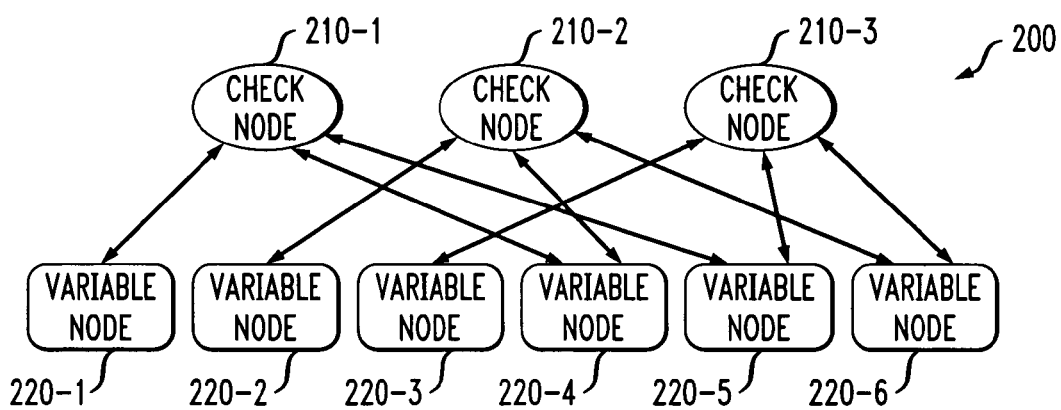
FIG. 1 illustrates a parity check matrix for an exemplary LDPC code.
FIG. 2 illustrates a Tanner graph constructed-from the parity check matrix of FIG. 1.
FIG. 3 illustrates a parity check matrix for an exemplary LDPC code that is an extension of the parity check matrix of FIG. 1.

FIG. 1 illustrates a parity check matrix 100 for an exemplary LDPC code. FIG. 2 illustrates a Tanner graph 200 constructed from the parity check matrix 100 of FIG. 1. As shown in FIG. 2, the Tanner graph 200 is comprised of a plurality of variable nodes 220 and check nodes 210. The check nodes 210 correspond to rows of the parity check matrix. The i-th check node corresponds to the i-th row of the parity check matrix, H. Similarly, variable nodes correspond to columns of H. The connection between a given check node 210-k and a given variable node 220-k is made if a 1 is present in the parity check matrix 100.

It is noted that while the parity check matrix 100 of FIG. 1 is not a low-density or sparse matrix as the mean value is 0.5, it will be used here for illustrative purposes. The Tanner graph 200 of FIG. 2 is a bipartite graph—one where the set of vertices can be divided into two distinct sets such that no two elements in the same set are connected by a single edge. There is a large amount of theory relating the girth, or minimum cycle length, to the performance of the code. It can be shown that a code having a large girth is generally preferable and will provide better performance than a code with a smaller girth.

LDPC codes can be classified in a number of ways. A parity check matrix is cyclic if each row (or column) is the previous row (or column) shifted one place across (or down) with wrap-around. In addition, parity check matrices can be said to have a quasi-cyclic structure.

FIG. 3 illustrates a parity check matrix 300 for an exemplary LDPC code that is an extension of the parity check matrix 100 of FIG. 1. As shown in FIG. 3, the parity check matrix 300 is comprised of cyclic submatrices $I_m^l$ where each submatrix $I_m^l$ is an m by m identity matrix cyclically-shifted by l positions. According to one aspect of the present invention, a Phi-node is assigned for each of these sub-matrices. As discussed below in conjunction with FIG. 9, these Phi-nodes are then connected to other blocks capable of calculating the 'row' and 'column' sums required for the decoding operation. Thus, there are as many Phi-nodes in the decoder as there are submatrices in the parity check matrix.

The parity check matrix 300 describes a rate ½ code (H has dimension (n-k, n) and rate=k/n). If m equals 1, then the parity check matrix 300 becomes:

$$H \begin{bmatrix} 1 & 0 & 0 & 1 & 1 & 0 \\ 0 & 1 & 0 & 1 & 0 & 1 \\ 0 & 0 & 1 & 0 & 1 & 1 \end{bmatrix},$$

and a (n, k) equal to (6, 3) code is provided. When m is equal to 3, however, the resultant parity check matrix 400 is shown in FIG. 4. The resultant parity check matrix 400 corresponds to a (n, k)=(18, 9) code. For m=1 and m=3 there are the same number of Phi-nodes, but each Phi-node holds three times the amount of data in the latter case. In other words, for a particular H matrix, each location of a '1' represents the location of an active Phi-node in the architecture. Each phi-node produces m-outputs based upon m-inputs.

All the Phi-nodes operate in parallel, in lock-step, processing their respective list of m inputs sequentially. Thus, the present invention provides an architecture where doubling the code length only doubles the processing time. This also means that for a given throughput, the clock speed is independent of the code length, so a very large code length can be used at no throughput cost.

Decoding LDPC Codes

In decoding a received codeword, the message most likely to have been sent is determined. FIG. 5 illustrates an exemplary decoding algorithm 500 for quasi-cyclic LDPC codes transmitted through an additive white Gaussian noise (AWGN) channel. The notation of FIG. 5 is defined as follows:

$y_i$ is the received sample for position i of the codeword.
$\sigma^2$ is the variance of the noise component of the received samples.
$p_i = \Pr(m_i=1|y_i)$ is the probability that bit i of the message is equal to 1, given observation $y_i$.
$q_{ij}(\chi)$ is the message passed from the $i^{th}$ variable node to the $j^{th}$ check node, being the probability that bit i of the message, $m_i$, is equal to $\chi$.
$r_{ji}(\chi)$ is the message passed from the $j^{th}$ variable node to the $i^{th}$ check node, being the probability that the $j^{th}$ parity check equation is satisfied given bit i of the message, $m_i$, is equal to $\chi$.
$\mathcal{R}_j$ is the set of columns in the parity check matrix with a '1' entry in the $j^{th}$ row.
$C_i$ is the set of rows in the parity check matrix with a '1' entry in the $i^{th}$ row.
$\mathcal{R}_j \backslash i$ is the set $\mathcal{R}_j$ with element i removed.
$C_i \backslash j$ is the set $C_i$ with element j removed.

The decoding algorithm of FIG. 5 progresses as follows:

Initialization: Variable nodes are initialized by computing the channel a posteriori probabilities for each bit, $p_i$ and $(1-p_i)$, using 500-1.

Repeat:
  Send messages $q_{ij}(0)$ and $q_{ij}(1)$ from variable nodes to check nodes.
  Compute messages $r_{ji}(0)$ and $r_{ji}(1)$ by combining the information received at each check node using equations 500-2 and 500-3.
  Send messages $r_{ji}(0)$ and $r_{ji}(1)$ from check nodes to variable nodes.
  Compute messages $q_{ij}(0)$ and $q_{ij}(1)$ by combining the information received at each variable node using equations 500-4 and 500-5.
  until either the parity check equations are satisfied or the maximum number of iterations is reached.

The exemplary decoding algorithm 500 of FIG. 5 involves a significant number of multiplications, an expensive operation. Thus, FIG. 6 illustrates an alternate decoding algorithm 600 for quasi-cyclic LDPC codes that converts multiplication operations to additions by operating in the logarithm (log) number domain. Generally, the decoding algorithm 600 of FIG. 6 replaces all $r_{ji}(0)$, $r_{ji}(1)$ values and similar values by the log-likelihood ratios, log $$\log\left(\frac{r_{ji}(0)}{r_{ji}(1)}\right).$$

In the log domain, when taking a "sum," the product of the signs are used to properly perform the multiplication as illustrated by 600-2.

The decoding algorithm of FIG. 6 progresses in a manner analogous to that of FIG. 5:

Initialization: Variable nodes are initialized by computing the log likelihood ratios $L_i$ for each bit based upon the received samples, using 600-1. Initialize messages log $q_{ij}$ using $L_i$.

Repeat:
  Send messages log $q_{ij}$ from variable nodes to check nodes.
  Compute messages log $r_{ji}$ by combining the information received at each check node using equation 600-2.
  Send messages log $r_{ji}$ from check nodes to variable nodes.

Compute bit log likelihood ratios by combining $L_i$ with the information received at each variable node, using 600-4.

Compute new messages log $q_{ij}$ by combining $L_i$ with the information received at each variable node using equation 600-3.

until either a valid codeword is reached (determined by making hard decisions from $Q_i$ and testing the parity check equations) or the maximum number of iterations is reached.

It is noted that the decoding algorithm 600 of FIG. 6 makes use of the function $\Phi(x)$, shown in FIG. 7, where:

$$\Phi(x) = -\log\left(\tanh\left(\frac{x}{2}\right)\right)$$

$$= -\log\left(\frac{e^x + 1}{e^x - 1}\right).$$

As shown in FIG. 7, the function $\Phi(x)$ is its own inverse.

Configurable Decoder Architecture for Quasi-Cyclic LDPC Codes

Figures 8, 9:
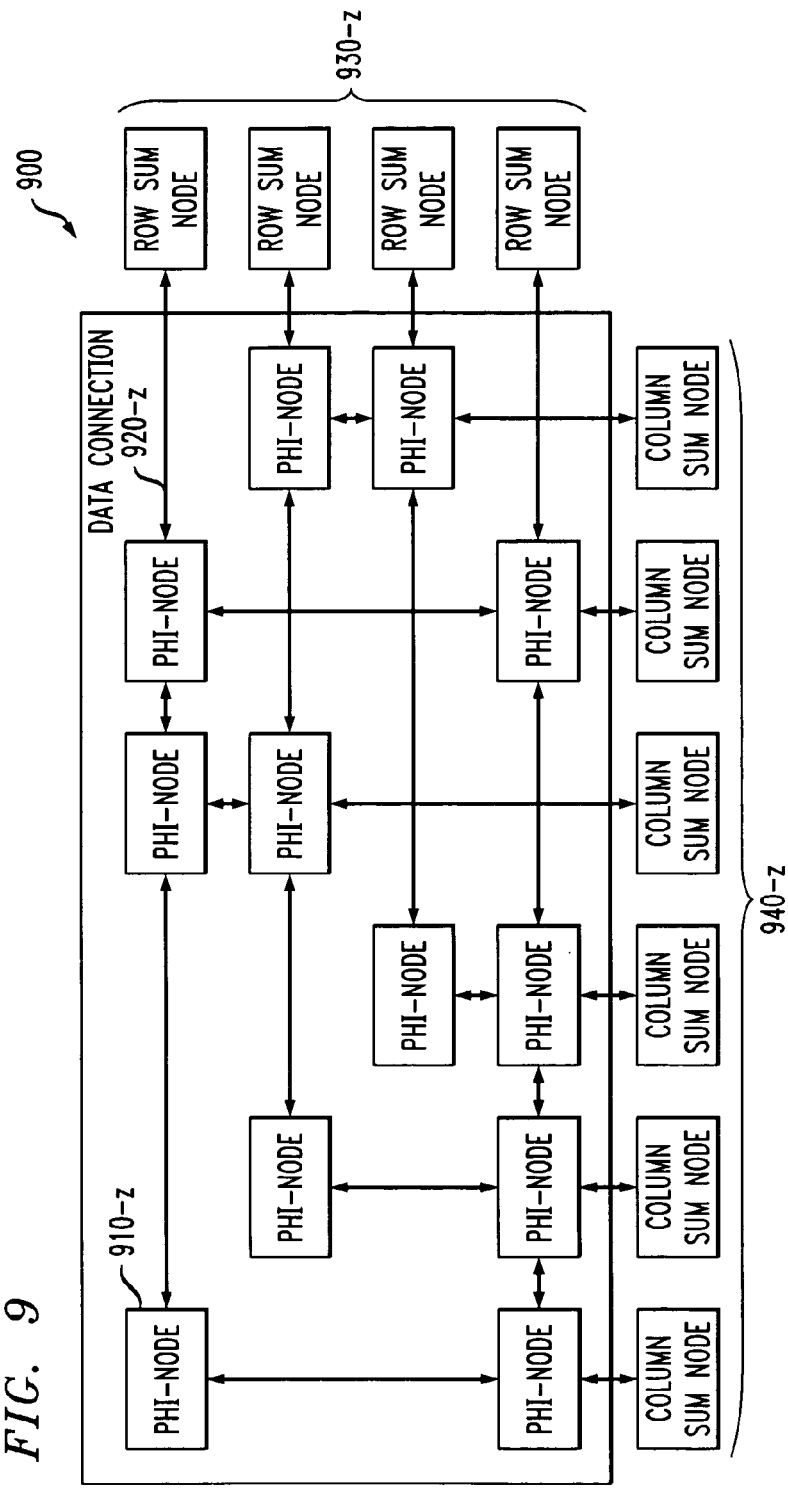
FIG. 8 illustrates a parity check matrix for an exemplary LDPC code.
FIG. 9 is a block diagram for a exemplary decoder architecture incorporating features of the present invention corresponding to the parity check matrix of FIG. 8.

FIG. 8 illustrates a parity check matrix 800 for an exemplary LDPC code. As shown in FIG. 8, the parity check matrix 800 is again comprised of cyclic submatrices $I_m^l$ where each submatrix $I_m^l$ is an m by m identity matrix cyclically-shifted by l. FIG. 9 is a block diagram for a corresponding exemplary decoder architecture 900 incorporating features of the present invention. A Phi-node 910 is assigned in the decoder architecture 900 for each of the sub-matrices in the parity check matrix 800, and for each row and column in the parity check matrix 800, there is a row and column summer 930, 940. Each Phi-node is then connected to the appropriate row and column summer 930, 940.

Each submatrix has dimension m by m. Thus, each submatrix has only m ones present. Calculations are only performed for positions where there is a one in the parity check matrix. Therefore, each Phi-node is responsible for m signed numbers. Similarly, each row and column summer operates on m elements.

Figure 10:
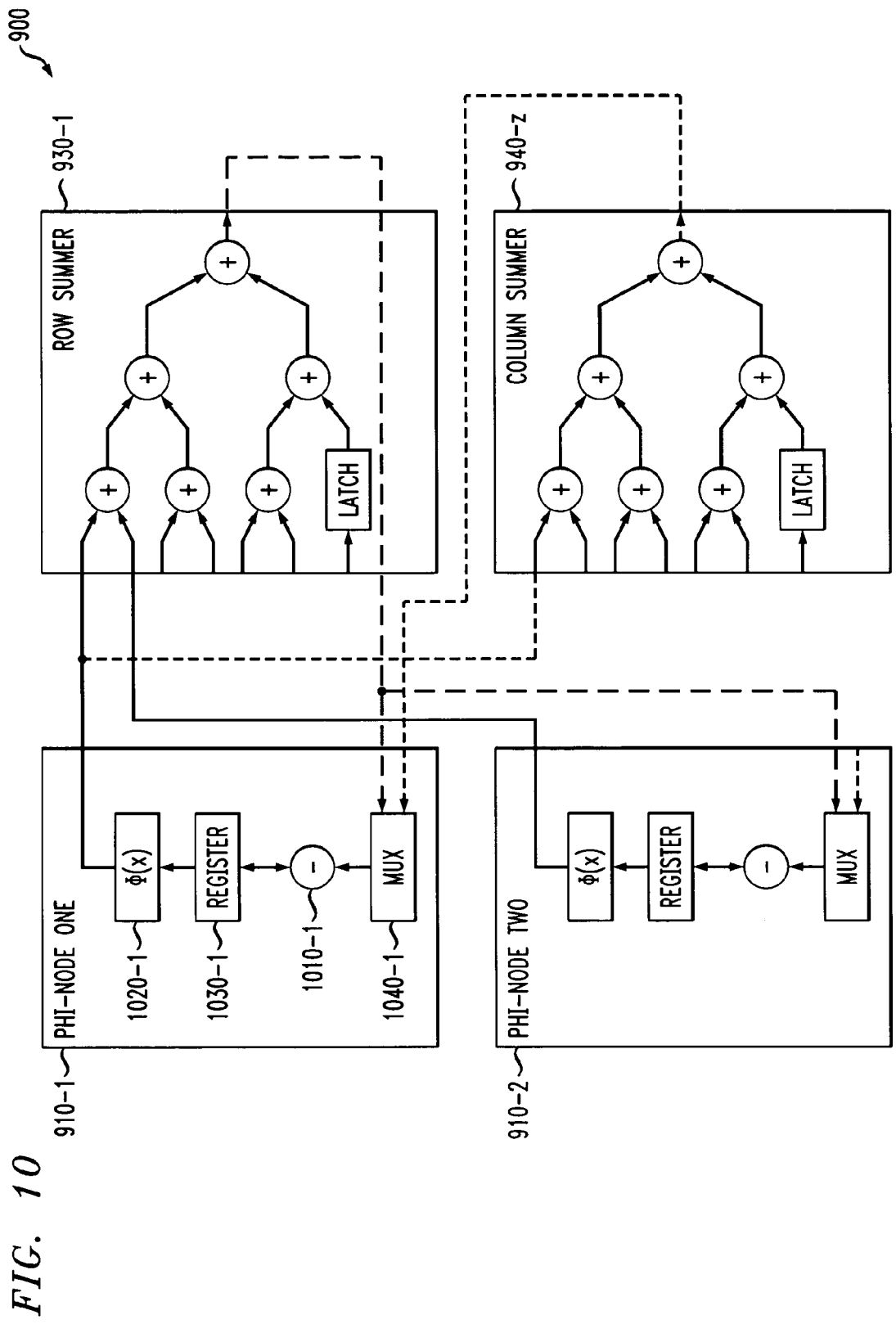
FIG. 10 is a block diagram illustrating aspects of the decoder architecture in further detail.

FIG. 10 is a block diagram 1000 illustrating aspects of the decoder architecture 900 in further detail. In particular, the block diagram 1000 illustrates how a given Phi-node 910-1 in the decoder architecture 900 of FIG. 9 is interconnected by data connections 920-z with other Phi-nodes, such as the Phi node 910-2, as well as row summers 930-z and column summers 940-z.

As shown in FIG. 10, each Phi-node 910-z, such as the Phi node 910-1, comprises a floating point subtractor 1010-1, a $\Phi(x)$ function computation unit 1020-1; a register 1030-1 to store the m elements the Phi node is responsible for; and a multiplexer 1040-1 for selecting a row or column inputs for each computation. Data paths 920 between Phi-nodes are reduced-range floating point numbers (e.g., sign bit, 4-bit mantissa+5-bit exponent with an implicit "1" on the mantissa). Each Phi-node connects to the corresponding row summer 930 and column summer 940. In this exemplary embodiment, the summers 930, 940 are capable of adding up to 7 floating point numbers. In an implementation where the dynamic range is small, the $\Phi(x)$ function computation unit 1020-1 can compute $\Phi(x)$ directly from the floating point input via a combinatorial logic lookup table.

The row and column summers 930, 940 consist of compression routines (Index->Float and Float->Index) to minimize the transfer of data, adders sufficient to add all the inputs and subtractors to subtract off the initial Phi-node value.

The circuitry within the Phi-node 910 can be replicated to support as many levels of parallelism as required. For example, greater parallelism can be achieved in the architecture 900 by widening the data paths so that two or more numbers can be transferred in the one clock cycle. This requires the appropriate duplication of the row/column summers 930, 940 and $\Phi(x)$ calculation units.

While an actual parity check matrix may have dimensions several thousand by several thousand, the parity check matrix can be divided into a much smaller matrix composed of many submatrices. Using the architecture 900 of FIG. 9, the decoding algorithm 600 of FIG. 6 can be implemented, for example, as follows. Each Phi-node has a set of memory elements denoted $x_i$, where i can take values from $\{0, \ldots, m-1\}$. In addition, this example architecture includes memories in the column summers to store the post-channel log likelihood ratios (LLRs), $L_j$. In the following steps, $r_j$ and $c_j$ represent the accumulated results in the row and column summers respectively. $R_j$ and $C_j$ represent the sets of connections from the Phi-nodes to the row and column summers, respectively.

1. From the received data, compute the log likelihood ratios (LLRs), $L_j$, and store in the column summers, 940. Copy the magnitude of the $L_j$ values into the appropriate $x_i$ memories within the Phi-nodes, 910, i.e. $x_i = |L_j|$.

2. Each Phi-node 910 calculates $x_i \leftarrow \Phi(x_i)$ (i.e. the result is written back into $x_i$).

3. The row summers, 930, sum the $x_i$ in the appropriate row, i.e., $r_j \leftarrow \Sigma_{x_j \in R_j} x_j$ and also calculate the parity (sign) of $r_j$.

4. The sum and sign (results) are returned to the Phi-node and the Phi-node value subtracted, i.e., $x_i \leftarrow r_j - x_i$.

5. Each Phi-node calculates $x_i \leftarrow \Phi(x_i)$ again. The Phi-nodes now contain the result of equation 600-2.

6. The column summers, 940, sum the appropriate columns and adds the initial LLRs $c_j \leftarrow (\Sigma_{x_i \in C_j} x_i) + L_j$. The sign bit is used to form the most likely codeword bit. This corresponds to the result of equation 600-4.

7. The sum and sign are returned to the Phi-node and the Phi-node stored value subtracted, i.e., $x_i \leftarrow c_j - x_i$. This is the result of equation 600-3.

Steps 2 through 5 correspond to 'Iteration Step 1' in FIG. 6. Steps 6 and 7 correspond to 'Iteration Step 2' in FIG. 6. Steps 2-7 are performed for all i values $\{0, \ldots, m-1\}$, thus completing one iteration, and the calculation of the best estimate to date of the most likely codeword. The results of step 6 can be used to determine if a valid codeword has been reached, thus permitting termination of the algorithm.

Iteration over steps 2-7 for each value of i is continued until either a valid codeword is reached and the algorithm terminated, or the maximum number of iterations is complete.

By increasing the parallelism factor more than one of $\{0, \ldots, m-1\}$ are operated on at a time.

It is noted that the architecture 900 performs a parity check. The sign bits of $c_j$ are used to form the codeword and on the next step these are loaded back into the Phi-nodes (preserving the sign). Calculating $\Phi(x)$ also preserves the sign and when the next row operation is performed, the sign bits are multiplied together. If the product is zero, this means that the row satisfies the parity equation. Thereafter, a test is performed to see if all rows are zero to see if it is a valid codeword.

Variable Block Length

According to one aspect of the invention, the architecture 900 allows for a variable block length by having the Phi-nodes responsible for differing amounts of data, in accordance with the value m of the submatrices. Thus, in one exemplary implementation, the register 1030 in each Phi-node 910 has sufficient memory, $m_{max}$, to store, for example, 96 elements. The memory elements that are actually used may be controlled, for example, by a switch. It is noted that as used herein, a "switch" can include any hardware or software device, capable of selectively enabling the memory elements. Any code with submatrix dimension up to $m_{max} \cdot m_{max}$ can be realized.

Variable Rate

According to another aspect of the invention, the architecture 900 provides a variable rate code decoder by having the ability to "turn off" extra Phi-nodes (for example, by setting the memory 1030 to 0). In this manner, whole rows and columns can be turned off. For example, the (6, 3) code specified by $$H = \begin{bmatrix} I_m^2 & 0 & 0 & I_m^{21} & I_m^{30} & 0 \\ 0 & I_m^3 & 0 & I_m^1 & 0 & I_m^{16} \\ 0 & 0 & I_m^7 & 0 & I_m^{11} & I_m^1 \end{bmatrix}$$

can be transformed into a (5, 3) code by turning off all the Phi-nodes in one column.

Variable Parity Check Matrix

According to a further aspect of the invention, the parity check matrix can optionally be configurable at runtime by turning off Phi-nodes and adding a column selector or multiplexer to each Phi-node. Phi-nodes can be turned off, for example, when every possible slot in the parity check matrix is populated, i.e., each of the n*(n-k) spaces specified by the parity check matrix. This, however, requires more gates. A column selector or multiplexer for each Phi-node can be implemented, for example, by hardwiring 8 Phi nodes to each row summer, and then adding a 1-4 multiplexer to each phi-node to select which of 4 columns the Phi node will be connected to. For example, by having the first Phi node (in each row) map to columns 1 to 4, the second Phi-node map to columns 3 to 6 and so on, many different parity check matrices can be substantiated.

Figure 11:
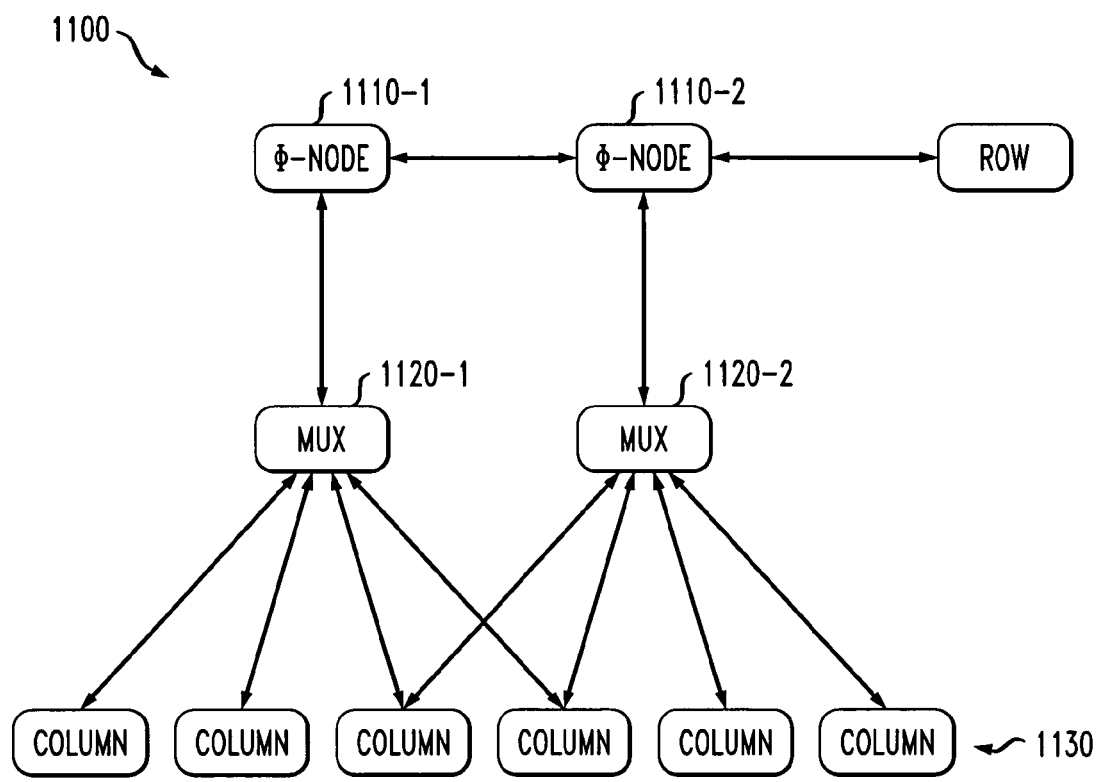
FIG. 11 illustrates an example configuration using multiplexer (Mux) elements to connect Phi-nodes to column summers.

FIG. 11 illustrates an example configuration 1100 using multiplexer (Mux) elements 1120 to connect Phi-nodes 1110 to column summers 1130. The following table enumerates all possible rows of H that can be realized with this configuration:

| | | | | | | | |
|---|---|---|---|---|---|---|---|
| 1 | | 1 | | | | | |
| 1 | | | 1 | | | | |
| 1 | | | | 1 | | | |
| 1 | | | | | 1 | | |
| | 1 | 1 | | | | | |
| | 1 | | 1 | | | | |
| | 1 | | | 1 | | | |
| | 1 | | | | 1 | | |
| | | 1 | 1 | | | | |
| | | 1 | | 1 | | | |
| | | 1 | | | 1 | | |
| | | | 1 | 1 | | | |
| | | | 1 | | 1 | | |
| 1 | | | | | | | |
| | 1 | | | | | | |
| | | 1 | | | | | |
| | | | 1 | | | | |
| | | | | 1 | | | |

The parity check matrices are low density (sparse). Thus, a combination of these two methods is highly effective in being able to implement many different parity check matrices. This method can be used in conjunction with the variable rate method to create different rate codes as well.

A plurality of identical die are typically formed in a repeated pattern on a surface of the wafer. Each die includes a device described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

It is to be understood that the embodiments and variations shown and described herein are merely illustrative of the principles of this invention and that various modifications may be implemented by those skilled in the art without departing from the scope and spirit of the invention.

We claim:

1. A decoder for an LDPC code based on a parity check matrix having a plurality of sub-matrices, wherein each row and column of said plurality of sub-matrices has a single non-zero entry, comprising:
   at least one Phi-node associated with each of said sub-matrices for decoding one or more error correction codes, wherein each Phi-node comprises a memory device having a plurality of memory elements, wherein one or more of said memory elements is configured to be selectively disabled.

2. The decoder of claim 1, wherein said plurality of memory elements comprises $m_{max}$ memory elements and wherein a code with submatrix dimension up to $m_{max} \cdot m_{max}$ can be realized.

3. The decoder of claim 1, wherein said memory elements is configured to be selectively disabled under control of a switch.

4. The decoder of claim 1, further comprising a $\Phi(x)$ function computation unit, where:

$$\Phi(x) = -\log\left(\frac{e^x + 1}{e^x - 1}\right).$$

5. The decoder of claim 4, wherein said $\Phi(x)$ function computation unit employs a combinatorial logic lookup table.

6. The decoder of claim 4, wherein said $\Phi(x)$ function computation unit may compute multiple results at a substantially similar time.

7. The decoder of claim 1, wherein each of said plurality of sub-matrices, $I_m^l$, is an m by m identity matrix cyclically-shifted by l.

8. A decoder for an LDPC code based on a parity check matrix having a plurality of sub-matrices, wherein each row and column of said plurality of sub-matrices has a single non-zero entry, comprising:
   at least one Phi-node associated with each of said sub-matrices for decoding one or more error correction codes, wherein at least one Phi node is configured to be selectively disabled.

9. The decoder of claim 8, wherein a row of Phi nodes is configured to be selectively disabled.

10. The decoder of claim 8, wherein a column of Phi nodes may be selectively disabled.

11. The decoder of claim 8, wherein said at least one Phi-node is selectively disabled by setting a memory associated with said Phi node to 0.

12. The decoder of claim 8, wherein each of said plurality of sub-matrices, $I_m^l$, is an m by m identity matrix cyclically-shifted by l.

13. A decoder for an LDPC code based on a parity check matrix having a plurality of sub-matrices, wherein each row and column of said plurality of sub-matrices has a single non-zero entry, comprising:

at least one Phi-node associated with each of said sub-matrices for decoding one or more error correction codes, wherein at least one Phi-node is configured to be selectively disabled at run-time and wherein said at least one Phi-node further comprises a multiplexer.

14. The decoder of claim 13, wherein said at least one Phi-node is configured to be selectively disabled under control of a switch.

15. The decoder of claim 13, wherein said at least one Phi-node is selectively disabled by setting a memory associated with said Phi-node to 0.

16. The decoder of claim 13, wherein a plurality of Phi-nodes are connected to a row summer and said multiplexer is a one-to-many multiplexer that selects the columns that said at least one Phi-node is connected to.

17. The decoder of claim 13, wherein each of said plurality of sub-matrices, $I_m^l$, is an m by m identity matrix cyclically-shifted by l.

18. A method for decoding an LDPC code based on a parity check matrix having a plurality of sub-matrices, wherein each row and column of said plurality of sub-matrices has a single non-zero entry, each of said sub-matrices having at least one associated Phi-node, wherein each Phi-node comprises a memory device having a plurality of memory elements, said method comprising:

selectively disabling one or more of said memory elements.

19. The method of claim 18, wherein said step of selectively disabling one or more of said memory elements is performed by a switch.

20. A method for decoding an LDPC code based on a parity check matrix having a plurality of sub-matrices, wherein each row and column of said plurality of sub-matrices has a single non-zero entry, each of said sub-matrices having at least one associated Phi-node, said method comprising:

selectively disabling at least one Phi-node.

21. The method of claim 20, wherein said step of selectively disabling at least one Phi-node further comprises the step of selectively disabling a row of Phi-nodes.

22. The method of claim 20, wherein said step of selectively disabling at least one Phi-node further comprises the step of selectively disabling a column of Phi-nodes.

23. The method of claim 20, wherein said step of selectively disabling at least one Phi-node further comprises the step of setting a memory associated with said Phi-node to 0.

24. The method of claim 20, wherein said step of selectively disabling at least one Phi-node is performed at run-time.

25. The method of claim 20, wherein said at least one associated Phi-node further comprises a multiplexer.

26. The method of claim 25, wherein a plurality of Phi-nodes are connected to a row summer and said multiplexer is a one-to-many multiplexer that selects the columns that said at least one Phi-node is connected to.

27. The method of claim 25, wherein a plurality of Phi-nodes are connected to a column summer and said multiplexer is a one-to-many multiplexer that selects the rows that said at least one Phi-node is connected to.

* * * * *